US012802204B2

(12) United States Patent
Shimoaoki et al.

(10) Patent No.: US 12,802,204 B2
(45) Date of Patent: Nov. 17, 2026

(54) SUBSTRATE PROCESSING APPARATUS, INFORMATION PROCESSING METHOD, AND STORAGE MEDIUM

(71) Applicant: Tokyo Electron Limited, Tokyo (JP)

(72) Inventors: Takeshi Shimoaoki, Kumamoto (JP); Hibiki Nakano, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 254 days.

(21) Appl. No.: 18/292,528

(22) PCT Filed: Jul. 6, 2022

(86) PCT No.: PCT/JP2022/026855
§ 371 (c)(1),
(2) Date: Jan. 26, 2024

(87) PCT Pub. No.: WO2023/008124
PCT Pub. Date: Feb. 2, 2023

(65) Prior Publication Data

US 2025/0005737 A1 Jan. 2, 2025

(30) Foreign Application Priority Data

Jul. 26, 2021 (JP) ................................ 2021-121648

(51) Int. Cl.
*G06T 7/00* (2017.01)
*G01L 13/00* (2006.01)
(Continued)

(52) U.S. Cl.
CPC ............. *G06T 7/001* (2013.01); *G01L 13/00* (2013.01); *G03F 7/30* (2013.01); *G06T 7/248* (2017.01);
(Continued)

(58) Field of Classification Search
CPC .................... G06T 7/001; G06T 7/248; G06T 2207/30148; G06T 2207/30164;
(Continued)

(56) References Cited

U.S. PATENT DOCUMENTS 6,647,777 B1 * 11/2003 Kotaka ................ G01F 1/6965 73/204.26
9,555,436 B2 * 1/2017 Uemae ...................... B05B 3/00
(Continued)

FOREIGN PATENT DOCUMENTS

JP 2019-096669 A 6/2019
TW 201349325 A 12/2013
(Continued)

OTHER PUBLICATIONS

International Search Report issued on Sep. 20, 2022 for WO 2023/008124 A1 (4 pages).

*Primary Examiner* — Kathleen Y Dulaney
(74) *Attorney, Agent, or Firm* — Venjuris, P.C.

(57) ABSTRACT

A substrate processing apparatus includes a nozzle that ejects a processing liquid to a periphery of a substrate; a processing liquid supply path that allows the processing liquid to flow between a supply source of the processing liquid and the nozzle; an image capturing unit that captures an image of the periphery of the substrate; an observation unit that is installed in the processing liquid supply path and observes a flowing state of the processing liquid in the processing liquid supply path; and an analysis unit that specifies an abnormality factor related to a supply of the processing liquid to the substrate based on the image captured by the image capturing unit and an observation result obtained by the observation unit.

19 Claims, 14 Drawing Sheets

(51) Int. Cl.
*G03F 7/30* (2006.01)
*G06T 7/246* (2017.01)
*H10P 72/00* (2026.01)

(52) U.S. Cl.
CPC ............... *G06T 2207/30148* (2013.01); *G06T 2207/30164* (2013.01); *H10P 72/0604* (2026.01)

(58) Field of Classification Search
CPC . G01L 13/00; G03F 7/30; G03F 7/168; H10P 72/0604; H10P 72/0414; H10P 72/0616; H10P 76/00; H10P 72/0424; B05C 11/08; G01R 29/12
USPC ........... 382/149; 118/72; 427/273; 73/204.26
See application file for complete search history.

(56) References Cited

U.S. PATENT DOCUMENTS

| | | | | |
|---|---|---|---|---|
| 10,665,481 | B2 * | 5/2020 | Sano | H10P 72/0414 |
| 2013/0084393 | A1 * | 4/2013 | Kashiyama | H10P 72/0448 118/712 |
| 2016/0271640 | A1 * | 9/2016 | Tomita | B05D 1/02 |
| 2019/0378739 | A1 * | 12/2019 | Kiyotomi | H10P 14/6342 |
| 2021/0387224 | A1 * | 12/2021 | Nakamura | B05C 11/00 |
| 2022/0005736 | A1 * | 1/2022 | Naohara | B05C 11/00 |

FOREIGN PATENT DOCUMENTS

| | | | |
|---|---|---|---|
| TW | M593058 | U | 4/2020 |
| TW | 202105651 | A | 2/2021 |

* cited by examiner

SUBSTRATE PROCESSING APPARATUS, INFORMATION PROCESSING METHOD, AND STORAGE MEDIUM

CROSS REFERENCE TO RELATED APPLICATIONS

This application is a national phase of PCT application No. PCT/JP2022/026855, filed on Jul. 6, 2022, which claims priority from Japanese patent application No. 2021-121648, filed on Jul. 26, 2021, all of which are incorporated herein by reference.

TECHNICAL FIELD

The present disclosure relates to a substrate processing apparatus, an information processing method, and a storage medium.

BACKGROUND

Patent Document 1 describes processing a semiconductor wafer for adjustment with a processing liquid in an application module, conveying the semiconductor wafer to an imaging module, and imaging an outer end surface and a back surface of the semiconductor wafer. In addition, Patent Document 1 discloses determining whether a height dimension of an outer edge of an application film relative to an inner edge of a bevel portion is acceptable, and if the height dimension is not acceptable, adjusting a rotation speed of the application module.

PRIOR ART DOCUMENT

Patent Document

Patent Document 1: Japanese Patent Laid-Open Publication No. 2019-096669

SUMMARY OF THE INVENTION

Problems to be Solved

The present disclosure provides a substrate processing apparatus capable of specifying an abnormality factor related to a supply of a processing liquid precisely and in detail.

Means to Solve the Problems

A substrate processing apparatus related to one aspect of the present disclosure includes a nozzle that ejects a processing liquid to a periphery of a substrate, a processing liquid supply path that allows the processing liquid to flow between a supply source of the processing liquid and the nozzle, an image capturing unit that captures an image of the periphery of the substrate, an observation unit that is installed in the processing liquid supply path and observes (monitors) a flowing state of the processing liquid in the processing liquid supply path, and an analysis unit that specifies an abnormality factor related to a supply of the processing liquid to the substrate based on the captured image by the image capturing unit and an observation result obtained by the observation unit.

Effect of the Invention

According to the present disclosure, it is possible to provide a substrate processing apparatus capable of specifying an abnormality factor related to a supply of a processing liquid precisely and in detail.

DETAILED DESCRIPTION TO EXECUTE THE INVENTION

Figure 1:
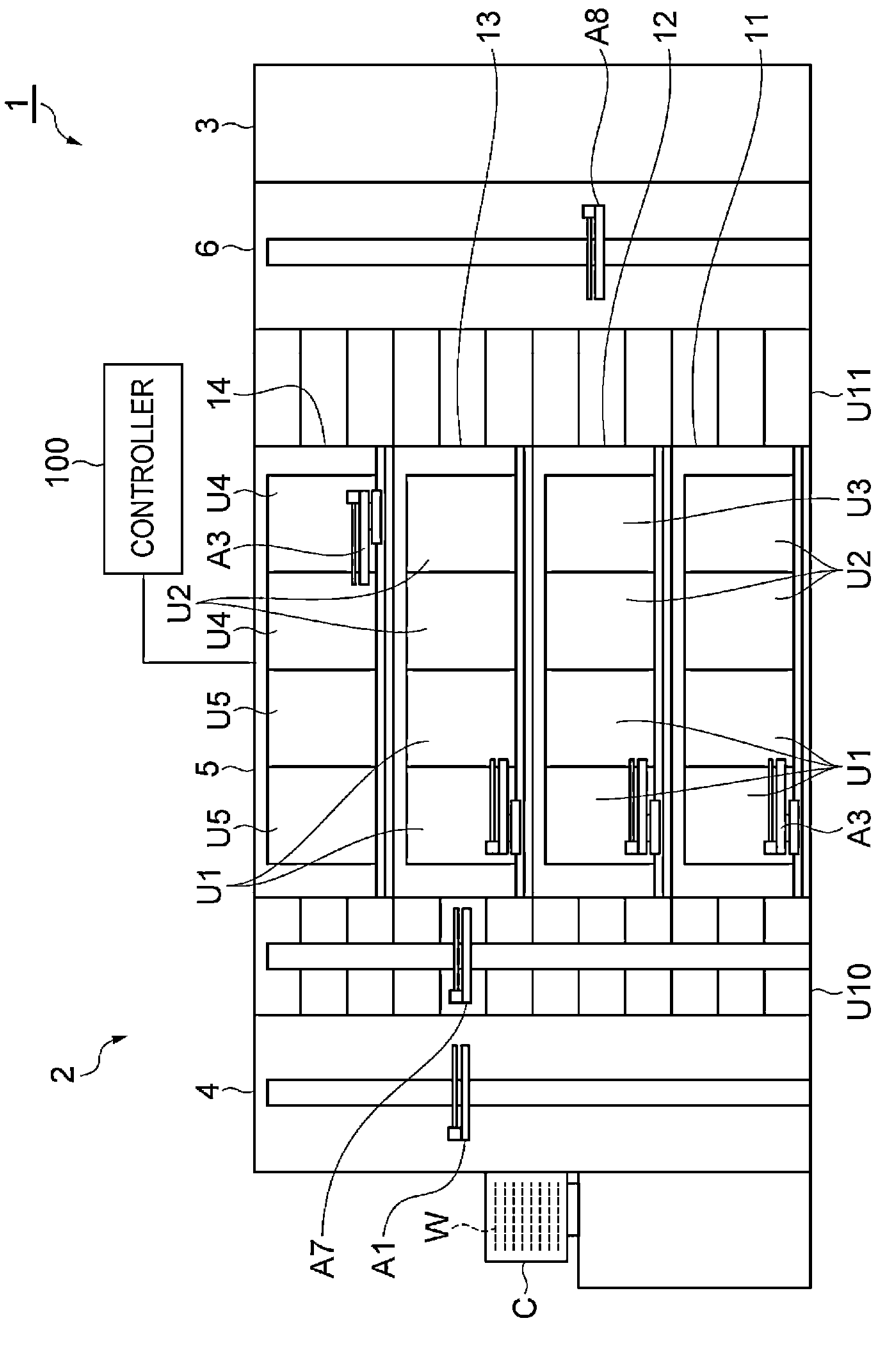
FIG. 1 is a view illustrating a schematic configuration of a substrate processing system.

Hereinafter, embodiments will be described in detail with reference to the drawings. In the descriptions, the same elements or elements having the same function are denoted by the same reference numerals, and redundant descriptions thereof will be omitted.

[Substrate Processing System]

A substrate processing system 1 is a system that forms a photosensitive film on a substrate, exposes the photosensitive film, and develops the photosensitive film. The substrate to be processed may include a semiconductor wafer, a glass substrate, a mask substrate, and a flat panel display (FPD). The substrate also includes a semiconductor wafer or the like on which a film has been formed in a previous process.

As illustrated in FIG. 1, the substrate processing system 1 includes an applying and developing apparatus 2 and an exposure apparatus 3. The exposure apparatus 3 performs exposure processing of a resist film (photosensitive film) formed on a substrate W. The substrate W is, for example, circular, and has a position indicator (e.g., a notch) on a periphery thereof, which serves as a reference for a position in a circumferential direction. Specifically, the exposure apparatus 3 irradiates energy rays to an exposure target portion of the resist film by a method such as liquid immersion exposure. The applying and developing apparatus 2 forms a resist film on a surface of the substrate W before exposure processing by the exposure apparatus 3 and develops the resist film after the exposure processing.

[Substrate Processing Apparatus]

Hereinafter, a configuration of the applying and developing apparatus 2 will be described as an example of the substrate processing apparatus. The applying and developing apparatus 2 includes a carrier block 4, a processing block 5, an interface block 6, and a controller 100.

The carrier block 4 introduces the substrate W into the applying and developing apparatus 2 and takes out the substrate W from the applying and developing apparatus 2. For example, the carrier block 4 may support a plurality of carriers C (accommodating portions) for the substrate W and includes a transfer arm A1. The carrier C accommodates several substrates W having, for example, a circular shape. The transfer arm A1 takes out the substrate W from the carrier C, delivers the substrate W to the processing block 5, receives the substrate W from the processing block 5, and returns the substrate W into the carrier C.

The processing block 5 has a plurality of processing modules 11, 12, 13, 14. The processing module 11 includes a plurality of application units U1, a plurality of heat treatment units U2, and a conveying arm A3 for conveying the substrate W to these units.

The processing module 11 forms a lower layer film on a surface of the substrate W by the application unit U1 and the heat treatment unit U2. The application unit U1 applies a processing liquid for forming the lower layer film to the substrate W. The heat treatment unit U2 performs various heat treatments associated with the formation of the lower layer film. The heat treatment unit U2 includes, for example, a heating plate and a cooling plate, and performs heat treatment by heating the substrate W with the heating plate and cooling the substrate W after heating with the cooling plate.

The processing module 12 (film formation processing unit) includes a plurality of application units U1, a plurality of heat treatment units U2, a plurality of inspection units U3, and a conveying arm A3 for conveying the substrate W to these units. The processing module 12 forms a resist film on the lower layer film by the application unit U1 and the heat treatment unit U2. The application unit U1 forms a film on the surface of the substrate W by applying a processing liquid for forming a resist film on the lower layer film. Hereinafter, this film is referred to as a "pre-bake resist film." The heat treatment unit U2 performs various heat treatments associated with the formation of the resist film. Thus, the pre-bake resist film becomes a resist film.

The application unit U1 is configured to remove at least a portion of the resist film (specifically, a periphery of the substrate W). Removing at least a portion of the resist film includes removing a portion of the pre-bake resist film prior to heat treatment by the heat treatment unit U2. For example, the application unit U1 removes a periphery of the pre-bake resist film by supplying a removal liquid to the periphery of the substrate W after forming the pre-bake resist film on the surface of the substrate W.

The inspection unit U3 performs processing for inspecting a state of a surface Wa (see FIG. 2) of the substrate W. For example, the inspection unit U3 obtains information indicating the state of the surface Wa of the substrate W. The information indicating the state of the surface Wa includes information about a portion of the substrate W from which the resist film has been removed (the periphery of the substrate W).

The processing module 13 includes a plurality of application units U1, a plurality of heat treatment units U2, and a conveying arm A3 for conveying the substrate W to these units. The processing module 13 forms an upper layer film on the resist film by the application unit U1 and the heat treatment unit U2. The application unit U1 of the processing module 13 applies a liquid for forming an upper layer film to the resist film. The heat treatment unit U2 of the processing module 13 performs a various heat treatments associated with the formation of the upper layer film.

The processing module 14 includes a plurality of development units U4, a plurality of heat treatment units U5, and a conveying arm A3 for conveying the substrate W to these units. The processing module 14 performs development processing of the resist film after exposure by the development unit U4 and the heat treatment unit U5. The development unit U4 applies a developer to the surface of the substrate W after exposure has been completed, and then cleans the surface of the substrate W with a rinse liquid, thereby developing the resist film. The heat treatment unit U5 performs various heat treatments associated with the development processing. Specific examples of the heat treatments include a post exposure bake (PEB) before development, and a post bake (PB) after development.

A shelf unit U10 is provided on a side of the carrier block 4 within the processing block 5. The shelf unit U10 is partitioned into a plurality of cells which line up in a vertical direction. A lifting arm A7 is provided near the shelf unit U10. The lifting arm A7 lifts and lowers the substrate W between the cells of the shelf unit U10.

A shelf unit U11 is provided on a side of the interface block 6 in the processing block 5. The shelf unit U11 is partitioned into a plurality of cells which line up in the vertical direction.

The interface block 6 transfers the substrate W to and from the exposure apparatus 3. For example, the interface block 6 includes a transfer arm A8, and is connected to the exposure apparatus 3. The transfer arm A8 delivers the substrate W disposed in the shelf unit U11 to the exposure apparatus 3, receives the substrate W from the exposure apparatus 3, and returns the substrate W to the shelf unit U11.

The controller 100 controls each element included in the applying and developing apparatus 2. Hereinafter, a series of control sequences executed by the controller 100 for one substrate W will be exemplified. For example, the controller 100 first controls the transfer arm A1 to convey the substrate W in the carrier C to the shelf unit U10, and controls the lifting arm A7 to dispose the substrate W in the cell for the processing module 11.

Then, the controller 100 controls the conveying arm A3 to convey the substrate W in the shelf unit U10 to the application unit U1 and the heat treatment unit U2 in the processing module 11. Furthermore, the controller 100 controls the application unit U1 and the heat treatment unit U2 to form a lower layer film on the surface of the substrate W. Thereafter, the controller 100 controls the conveying arm A3 to return the substrate W on which the lower layer film is formed to the shelf unit U10, and controls the lifting arm A7 to dispose the substrate W in the cell for the processing module 12.

Then, the controller 100 controls the conveying arm A3 to convey the substrate W in the shelf unit U10 to the application unit U1 and the heat treatment unit U2 in the processing module 12. Furthermore, the controller 100 controls the application unit U1 and the heat treatment unit U2 to form a resist film on the lower layer film of this substrate W. Further, the controller 100 forms the pre-bake resist film on the lower layer film of the substrate W, controls the application unit U1 to remove the periphery of the pre-bake resist film, and controls the heat treatment unit U2 to perform heat treatment on the substrate W to turn the pre-bake resist film into a resist film.

Further, the controller 100 controls the conveying arm A3 to convey the substrate W to the inspection unit U3 and obtains information indicating a surface state of the substrate W from the inspection unit U3. Thereafter, the controller 100 controls the conveying arm A3 to return the substrate W to the shelf unit U10 and controls the lifting arm A7 to dispose the substrate W in the cell for the processing module 13.

Then, the controller 100 controls the conveying arm A3 to convey the substrate W in the shelf unit U10 to each unit in the processing module 13, and controls the application unit U1 and the heat treatment unit U2 to form an upper layer film on the resist film of the substrate W. Thereafter, the controller 100 controls the conveying arm A3 to convey the substrate W to the shelf unit U11.

Then, the controller 100 controls the transfer arm A8 to deliver the substrate W in the shelf unit U11 to the exposure apparatus 3. Thereafter, the controller 100 controls the transfer arm A8 to receive the substrate W on which exposure processing has been performed from the exposure apparatus 3 and dispose the substrate W in the cell for the processing module 14 in the shelf unit U11.

Next, the controller 100 controls the conveying arm A3 to convey the substrate W in the shelf unit U11 to the development unit U4 and the heat treatment unit U5 in the processing module 14, and controls the development unit U4 and the heat treatment unit U5 to perform development processing on the resist film of the substrate W. Then, the controller 100 controls the conveying arm A3 to return the substrate W to the shelf unit U10 and controls the lifting arm A7 and the transfer arm A1 to return the substrate W into the carrier C. A series of control sequences for one substrate W are completed.

[Application Unit]

Next, an example of a configuration of the application unit U1 in the processing module 12 will be described in detail. As described above, the application unit U1 supplies a processing liquid for forming a resist film to the surface Wa of the substrate W, thereby forming the pre-bake resist film. Furthermore, after forming the pre-bake resist film on the surface Wa of the substrate W, the application unit U1 removes the periphery of the pre-bake resist film by supplying a removal liquid to the periphery of the substrate W.

Figure 2:
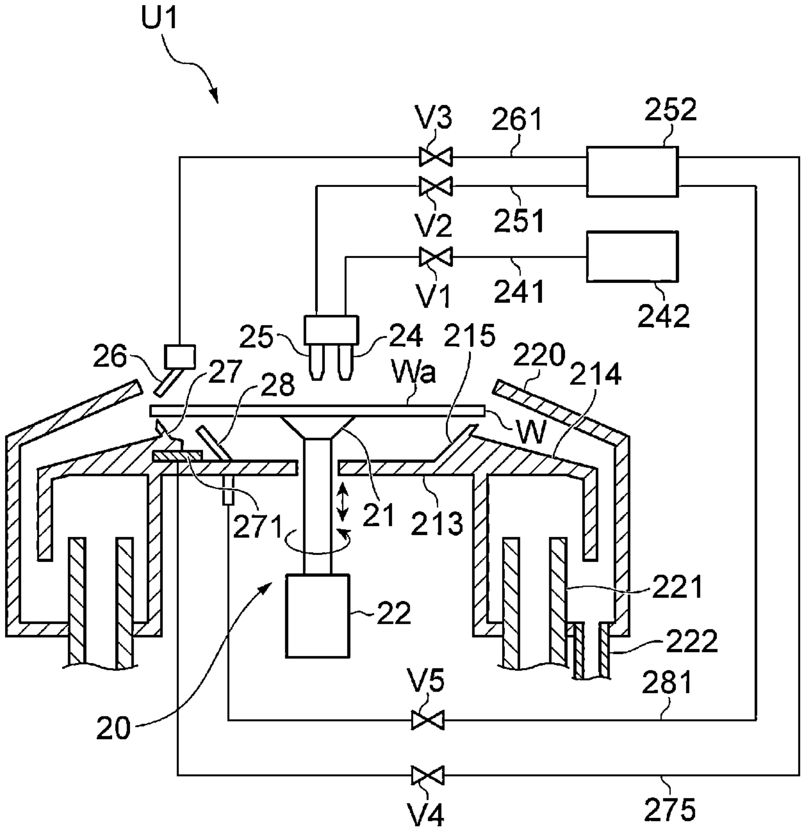
FIG. 2 is a view illustrating a schematic configuration of an application unit.

As illustrated in FIG. 2, the application unit U1 has a rotary holding unit 20. The rotary holding unit 20 holds and rotates the substrate W. For example, the rotary holding unit 20 has a holding unit 21 and a rotary driving unit 22. The holding unit 21 is a spin chuck that supports the substrate W which is horizontally disposed with its surface facing upward and holds the substrate W by suction (e.g., vacuum suction). The rotary driving unit 22 rotates the holding unit 21 around a vertical rotation center, for example, using an electric motor as a power source. Accordingly, the substrate W rotates.

A cup 220 is provided around the substrate W held in the holding unit 21, and a lower portion of the cup 220 is exhausted through an exhaust pipe 221 and also, is connected to a drainage pipe 222. In addition, a circular plate 213 is installed below the holding unit 21 to surround a shaft, and a ring-shaped chevron portion 214 having a chevron-shaped cross-section is formed around the circular plate 213. At a top of the chevron portion 214, a protrusion 215 is provided to prevent mist flowing inside the cup 220 from flowing into a back surface of the substrate W.

The application unit U1 has an application liquid nozzle 24 that ejects an application liquid, and a solvent nozzle 25 that ejects a solvent of the application liquid. The application liquid nozzle 24 is connected to an application liquid supply mechanism 242 through a flow path 241 provided with an opening/closing valve V1. The solvent nozzle 25 is a nozzle used for pretreatment which is conducted before ejecting the application liquid onto the substrate W, and is connected to a solvent supply mechanism 252 through a flow path 251 provided with an opening/closing valve V2. The application liquid nozzle 24 and the solvent nozzle 25 are configured to move freely between an upper portion of a center of the substrate W and a retracted position outside the cup 220 by a movement mechanism (not illustrated).

In addition, the application unit U1 has a removal liquid nozzle 26 which is a nozzle for film removal on the periphery of the substrate W, a bevel cleaning nozzle 27 for film removal on a bevel portion, and a back surface cleaning nozzle 28. The removal liquid nozzle 26 is an edge bead removal (EBR) nozzle that ejects a removal liquid (processing liquid) to the periphery of the substrate W. The removal liquid nozzle 26 ejects the removal liquid to a surface located inside the bevel portion of the substrate W held by the holding unit 21 so that the removal liquid is directed downstream in a rotation direction of the substrate W. The removal liquid nozzle 26 is formed, for example, in a straight pipe shape, and its tip is open as an ejection port for the removal liquid. This removal liquid nozzle 26 is configured to freely move between, for example, a processing position where the removal liquid is ejected to the periphery of the substrate W and the retracted position outside the cup 220 by a moving mechanism (not illustrated).

The bevel cleaning nozzle 27 ejects the removal liquid from a back side of the substrate W held by the holding unit 21 toward the bevel portion. This bevel cleaning nozzle 27 is configured to move freely along a base 271, and the base 271 is provided in, for example, a cut-out (not illustrated) formed in the chevron portion 214.

The back surface cleaning nozzle 28 ejects a cleaning liquid onto the back surface located inside the bevel portion of the substrate W held by the holding unit 21. The back surface cleaning nozzle 28 is configured so that, for example, when the cleaning liquid is ejected toward the substrate W, a landing point of the cleaning liquid on the substrate W is located at a position, for example, 70 mm inside from an outer edge of the substrate W. For example, two bevel cleaning nozzles 27 and two back surface cleaning nozzles 28 are provided in the application unit U1.

Both the removal liquid and the cleaning liquid in this example are solvents for the application film, and the removal liquid nozzle 26 is connected to the solvent supply mechanism 252 through a flow path 261 provided with an opening/closing valve V3. In this manner, the flow path 261 serves as a supply path (processing liquid supply path) for the removal liquid, which is a processing liquid, and allows the removal liquid to flow between the solvent supply mechanism 252, which is a supply source of the removal liquid, and the removal liquid nozzle 26. In addition, the bevel cleaning nozzle 27 is connected to the solvent supply mechanism 252 through a flow path 275 provided with an opening/closing valve V4. In addition, the back surface cleaning nozzle 28 is connected to the solvent supply mechanism 252 through a flow path 281 provided with an opening/closing valve V5.

(Processing Liquid Supply Path)

Figure 3:
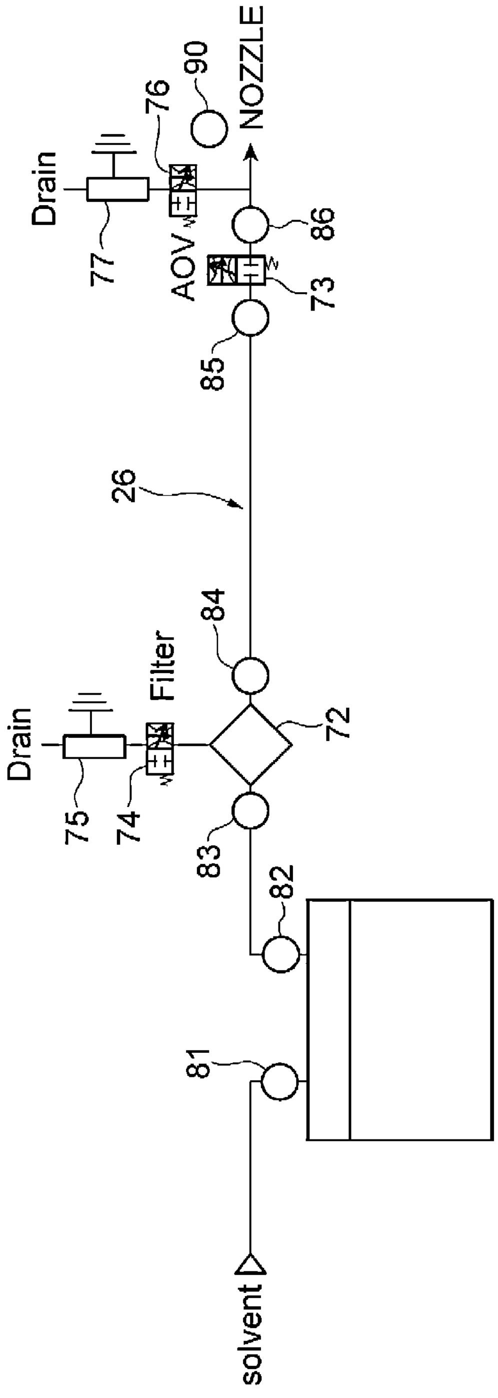
FIG. 3 is a diagram explaining a configuration of monitoring in a processing liquid supply path.

A monitoring configuration in the flow path 261, which is the processing liquid supply path, will be described with reference to FIG. 3. In the flow path 261, for example, a pump 71 which pumps the removal liquid (processing liquid) from the supply source, a filter 72, and a valve 73 are disposed from an upstream side to a downstream side. That is, the removal liquid pumped by the pump 71 passes through the filter 72, passes through the valve 73 in an open state, and reaches the removal liquid nozzle 26 (see FIG. 2).

The removal liquid nozzle 26 ejects the removal liquid to the periphery of the substrate W as described above. Additionally, the filter 72 is connected to a drain through a valve 74. A conductive grounding component 75 may be provided in the drain. In addition, a downstream portion of the valve 73 or upstream portion of the removal liquid nozzle 26 in the flow path 261 is connected to the drain via a valve 76. A conductive ground component 77 may be provided in the drain.

The application unit U1 includes various sensors 81, 82, 83, 84, 85, 86, and 90 (observation units) which are installed in the flow path 261 serving as the processing liquid supply path and observe a flowing state of the removal liquid (processing liquid) in the flow path 261. The sensors 81 and 82 are sensors which observe a flowing state of the removal liquid before and after the pump 71 provided in the flow path 261. The sensors 83 and 84 are sensors which observe the flowing state of the removal liquid before and after the filter 72 provided in the flow path 261. The sensors 85 and 86 are sensors which observe the flowing state of the removal liquid before and after the valve 73 provided in the flow path 261.

The sensors 81, 82, 83, 84, 85, and 86 may include, for example, any one of a flow meter which measures a flow rate of the removal liquid, a liquid pressure sensor which measures liquid pressure of the removal liquid, and a surface electrometer which measures a surface potential of the removal liquid. The sensors 81, 82, 83, 84, 85, and 86 transmit observation results to the controller 100. The sensor 90 is a sensor which observes an ejection (flow) state of the removal liquid ejected from the removal liquid nozzle 26 through the flow path 261, and is, for example, a small high-speed camera. In the case of the small high-speed camera, the sensor 90 captures an image of the ejection state of the removal liquid nozzle 26 and transmits a result of the captured image to the controller 100.

[Inspection Unit]

Figure 4:
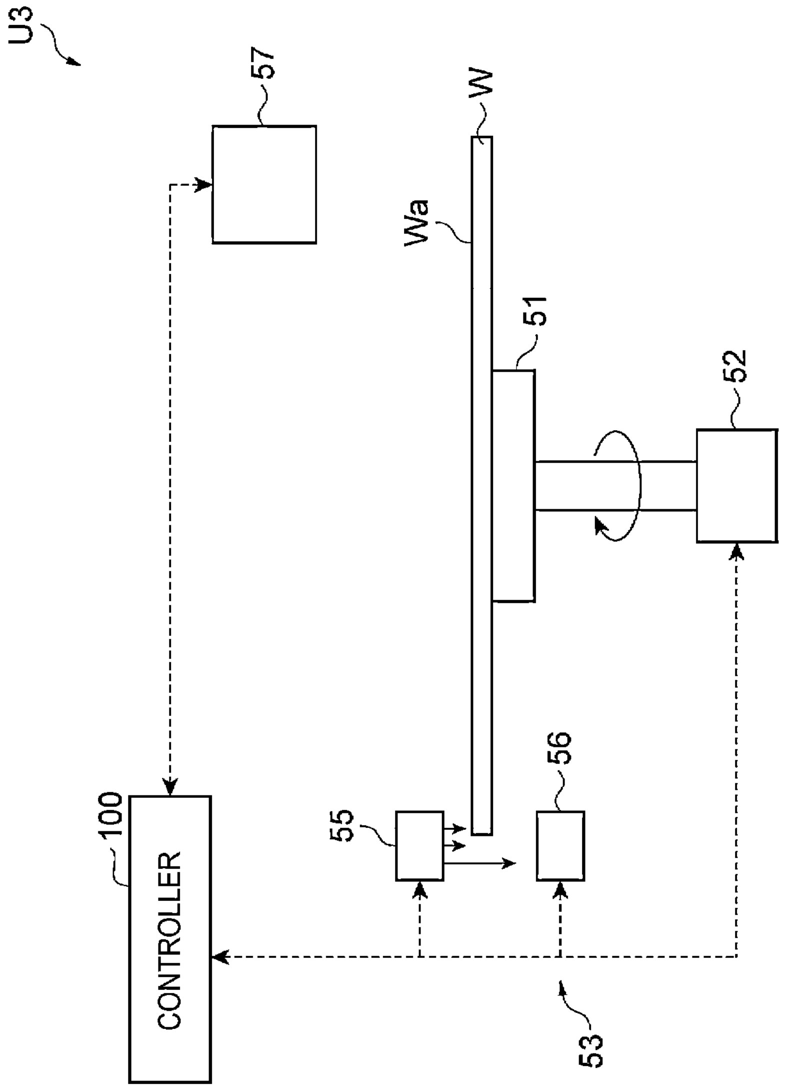
FIG. 4 is a view illustrating a schematic configuration of an inspection unit.

Next, an example of a configuration of the inspection unit U3 will be described in detail. The inspection unit U3 acquires image data as surface information indicating the state of the surface Wa by capturing an image of the surface Wa of the substrate W. As illustrated in FIG. 4, the inspection unit U3 has a holding unit 51, a rotary driving unit 52, a position indicator detection unit 53, and an image capturing unit 57.

The holding unit 51 supports the substrate W disposed horizontally with its surface Wa facing upward, and holds the substrate W by suction (e.g., vacuum suction). The rotary driving unit 52 rotates the holding unit 51 around the vertical rotation center using a power source such as an electric motor. Accordingly, the substrate W rotates.

The position indicator detection unit 53 detects a notch in the substrate W. For example, the position indicator detection unit 53 has a light transmitting unit 55 and a light receiving unit 56. The light transmitting unit 55 emits light toward the periphery of the rotating substrate W. For example, the light transmitting unit 55 is disposed above the periphery of the substrate W and emits light downward. The light receiving unit 56 receives light emitted by the light transmitting unit 55. For example, the light receiving unit 56 is disposed below the periphery of the substrate W so as to face the light transmitting unit 55.

The image capturing unit 57 is a camera that captures images of at least the periphery of the surface Wa of the substrate W. For example, the image capturing unit 57 captures an image of the periphery of the surface Wa of the substrate W where the resist film is not formed (the pre-bake resist film has been removed). For example, the image capturing unit 57 is disposed above the periphery of the substrate W held by the holding unit 51 and faces downward. The image capturing unit 57 transmits a result of capturing the image to the controller 100.

[Controller]

The above-described application unit U1 and inspection unit U3 are controlled by the controller 100. A control sequence of the application unit U1 and the inspection unit U3 by the controller 100 includes causing the application unit U1 to remove the periphery of the resist film formed on the surface Wa of the substrate W. In addition, the control sequence by the controller 100 includes acquiring, from the inspection unit U3, an captured image of the periphery of the substrate W after the removal liquid is supplied. Additionally, the control procedure by the controller 100 includes acquiring, from the application unit U1, an observation result of the flowing state of the removal liquid in the flow path 261 which is a removal liquid (processing liquid) supply path. Additionally, the control sequence by the controller 100 includes specifying abnormality factors related to the supply of the removal liquid to the substrate W based on the captured image and the observation result.

Specifying the abnormality factors related to the supply of the removal liquid means, when abnormality occurs in the supply of the removal liquid, specifying which region is poor and how poor it is.

Figure 5:
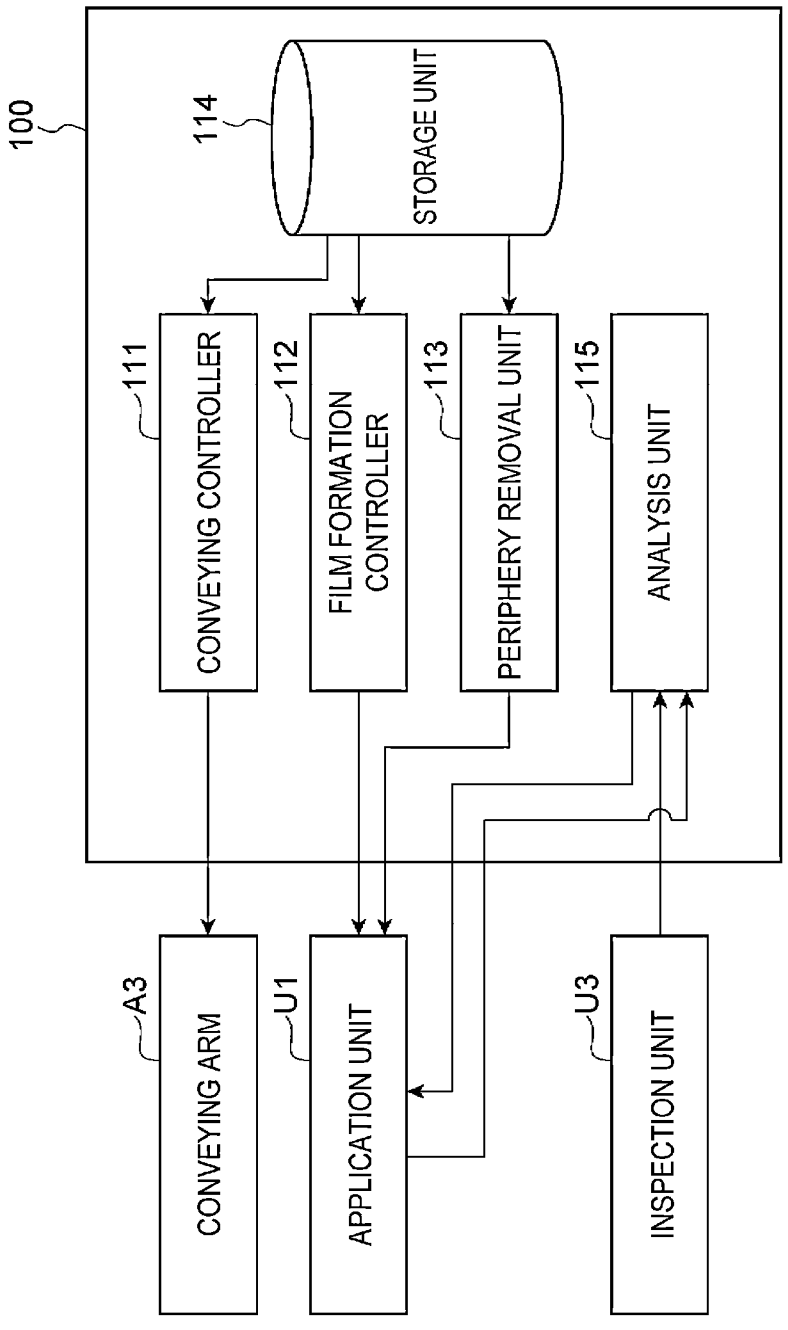
FIG. 5 is a diagram illustrating a functional configuration of a controller.

Hereinafter, a configuration of the controller 100 for controlling the application unit U1 and the inspection unit U3 will be specifically illustrated with reference to FIG. 5. As illustrated in FIG. 5, the controller 100 includes a conveying controller 111, a film formation controller 112, a periphery removal unit 113, a storage unit 114, and an analysis unit 115, serving as functional components (hereinafter, referred to as "functional blocks").

The conveying controller 111 controls the conveying arm A3 to convey the substrate W based on an operation program stored in the storage unit 114. The operation program of the conveying arm A3 includes a time series of commands defined by at least one control parameter. Specific examples of the at least one control parameter include a conveying target position of the substrate W and a movement speed to the conveying target position.

The film formation controller 112 controls the application unit U1 to form a pre-bake resist film on the surface of the substrate W based on the operation program stored in the storage unit 114. The periphery removal unit 113 controls the application unit U1 to remove a periphery of the pre-bake resist film based on the operation program stored in the storage unit 114.

The analysis unit 115 specifies abnormality factors related to the supply of the removal liquid to the substrate W based on the result of capturing the image by the image capturing unit 57 (the captured image of the periphery after the removal liquid is supplied) and the observation result by the various sensors 81, 82, 83, 84, 85, 86, 90 of the application unit U1.

The analysis unit 115 may first specify a defect mode based on each pixel value of an inner circumferential area of the substrate W, rather than an area of the periphery from which the pre-bake resist film has been removed, for example, in the image captured by the image capturing unit

57. Here, the inner circumferential area is an area which is inward from the area of the periphery and where it is assumed that the pre-bake resist film is not removed.

Figure 6A:
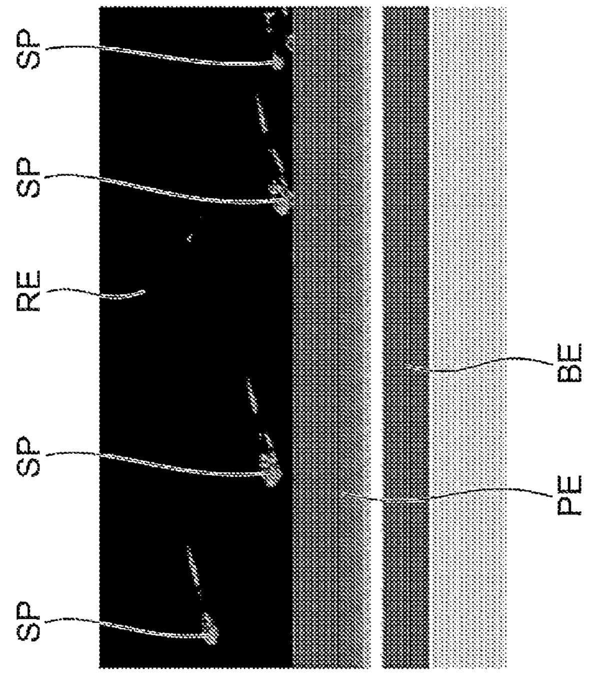
FIGS. 6A and 6B are views explaining splashes and roughness, which are specific aspects of defect modes.
Figure 6B:
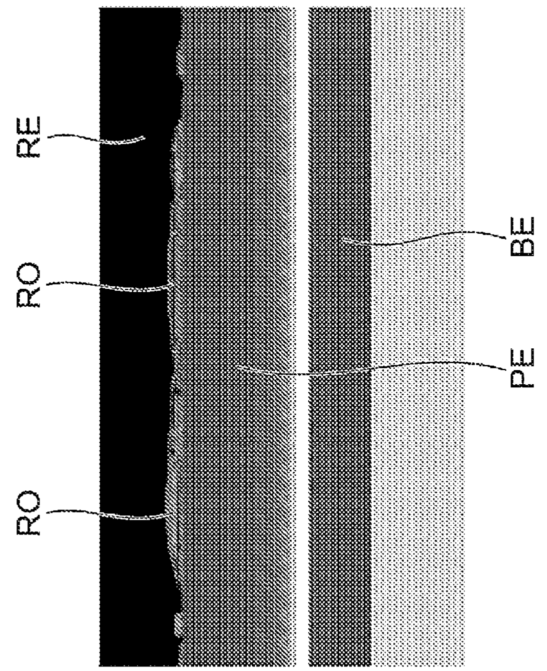

FIGS. 6A and 6B are views explaining splashes (FIG. 6A) and roughness (FIG. 6B), which are specific aspects of defect modes. As illustrated in FIGS. 6A and 6B, in a state where the pre-bake resist film on the periphery is removed by the removal liquid, a bevel portion BE, a periphery PE from which the pre-bake resist film is removed, and a resist portion RE are formed sequentially from an outer circumference to an inner circumference of the substrate W.

Here, in an embodiment illustrated in FIG. 6A, splashes SP of the removal liquid are scattered on a part of the resist portion RE due to certain abnormality. This splash abnormality is a type of the defect mode. An occurrence factor of the splash abnormality may be for example, the removal liquid that once hits the cup 220 and splashes onto the resist portion RE, or an abnormality occurring in the flowing state of the removal liquid (further, the ejection state thereof from the removal liquid nozzle 26) in the flow path 261.

Furthermore, in an embodiment illustrated in FIG. 6B, a roughness portion RO having a rough and uneven surface is formed at the boundary between the periphery PE and the resist portion RE. This roughness abnormality is a type of the defect mode. An occurrence factor of the roughness abnormality may be an abnormality occurring in the flowing state of the removal liquid (further, the ejection state thereof from the removal liquid nozzle 26) in the flow path 261.

Figure 7:
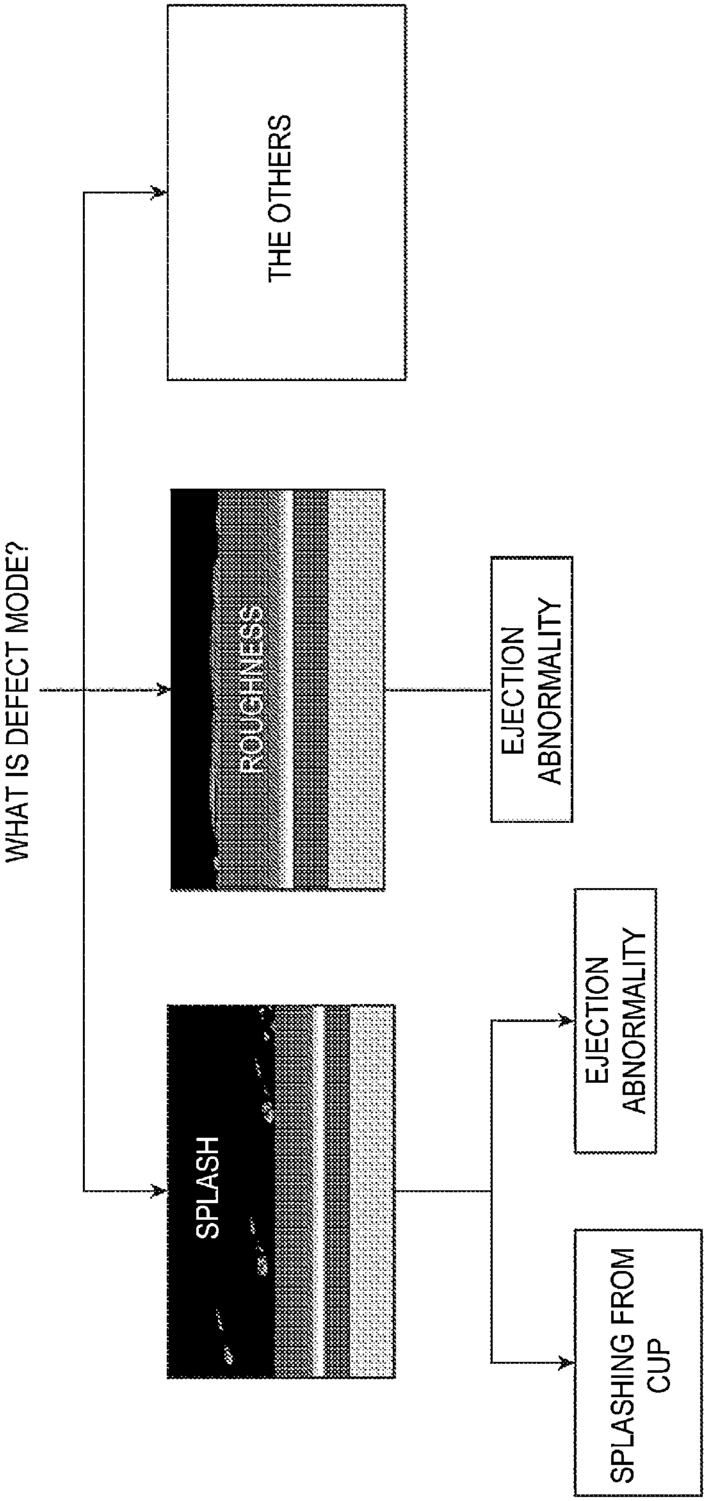
FIG. 7 is a diagram explaining classification of the defect modes.

FIG. 7 is a diagram explaining classification of the defect modes performed by the analysis unit 115. The analysis unit 115 first performs classification of the defect mode based on each pixel value in the inner circumferential area of the substrate W rather than the area of the periphery from which the pre-bake resist film has been removed in the image captured by the image capturing unit 57. The analysis unit 115 classifies the defect mode as one of splash abnormality, roughness abnormality, or another abnormality. In the captured image, the analysis unit 115 specifies the defect mode as splash abnormality (first defect mode) when each pixel value of the inner circumferential area of the substrate W (the resist portion RE in the example of FIG. 6A) rather than the area of the periphery becomes a discrete value.

In the captured image, the analysis unit 115 specifies the defect mode as roughness abnormality (second defect mode) when each pixel value of the inner circumferential area of the substrate W (the resist portion RE in the example of FIG. 6B) rather than the area of the periphery is a continuous value. As described above, the occurrence factor of the splash abnormality may be the splash of the removal liquid from the cup 220 or the flowing state of the removal liquid in the flow path 261 (further, the ejection state thereof from the removal liquid nozzle 26). Additionally, the occurrence factor of the roughness abnormality may be the flowing state of the removal liquid in the flow path 261 (furthermore, the ejection state thereof from the removal liquid nozzle 26). When the analysis unit 115 is not able to distinguish the defect mode as any one of splash abnormality and roughness abnormality, the defect mode is specified as another abnormality.

When the analysis unit 115 specifies the defect mode as splash abnormality, based on the image captured by the image capturing unit 57, and the splash of the removal liquid from the cup 220 is suspected as an occurrence factor, the analysis unit 115 performs a first defect resolution process below. In the first defect resolution process, the analysis unit 115 determines whether a recipe related to the removal of the periphery has not been changed. Further, in the first defect resolution process, the analysis unit 115 determines whether a type of the cup 220 has not been changed, the solvent has not been changed, or there is no tendency of causing splash abnormality in a processing unit (module unit) related to the removal of the periphery.

When the recipe is changed, the analysis unit 115 investigates a difference in the recipe in detail. In addition, the analysis unit 115 investigates dependency of the cup 220 when the type of cup 220 is changed, examines recipe optimization for each solvent type when the solvent is changed, and investigates an individual difference in the cup 220 if there is a tendency to occur in each module. When none of the cases is matched, the analysis unit 115 specifies the flowing state of the removal liquid in the flow path 261 (furthermore, the ejection state thereof from the removal liquid nozzle 26), which is considered as another occurrence factor, as an occurrence factor. The first defect resolution process may be entirely performed by a user (user of the applying and developing apparatus 2), rather than the analysis unit 115.

When the defect mode is the splash abnormality and the flowing state of the removal liquid in the flow path 261 (further, the ejection state thereof from the removal liquid nozzle 26) is suspected an occurrence factor, the analysis unit 115 performs a second defect resolution process below, based on the image captured by the image capturing unit 57. Similarly, when the defect mode is the roughness abnormality, the analysis unit 115 performs the second defect resolution process below. In the second defect resolution process, the analysis unit 115 specifies abnormality factors (which region is poor and how poor it is) based on the specified type of the defect mode and the observation result by the various sensors 81, 82, 83, 84, 85, 86, and 90 of the application unit U1.

In this case, the analysis unit 115 may acquire the flowing state before and after the pump 71 from the sensors 81 and 82, and the flowing state before and after the filter 72 from the sensors 83 and 84, and the flowing state before and after the valve 73 from the sensors 85 and 86. The analysis unit 115 may specify an abnormality factor related to the pump 71 when the flowing state obtained from the sensors 81 and 82 is abnormal. In addition, the analysis unit 115 may specify an abnormality factor related to the filter 72 when the flowing state obtained from the sensors 83 and 84 is abnormal. In addition, the analysis unit 115 may specify an abnormality factor related to the valve 73 when the flowing state obtained from the sensors 85 and 86 is abnormal.

For example, when the various sensors 81, 82, 83, 84, 85, and 86 include a flow meter, the analysis unit 115 may specify the abnormality factor based on whether a flow rate of the removal liquid measured by the flow meter is within a predetermined range. When the flow rate of the removal liquid measured by the flow meter is outside a predetermined range, the analysis unit 115 determines that a flowing state of a configuration corresponding to the flow meter is poor.

Figure 8A:
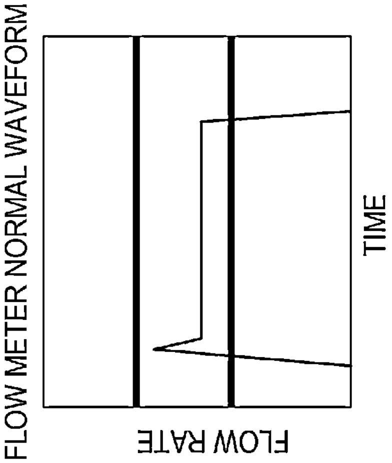
FIGS. 8A to 8C are diagrams explaining monitoring using a flow meter.
Figure 8B:
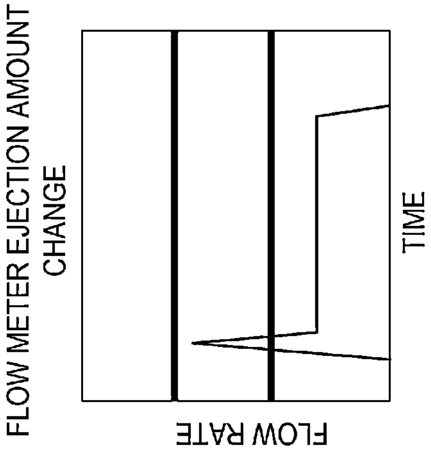
Figure 8C:
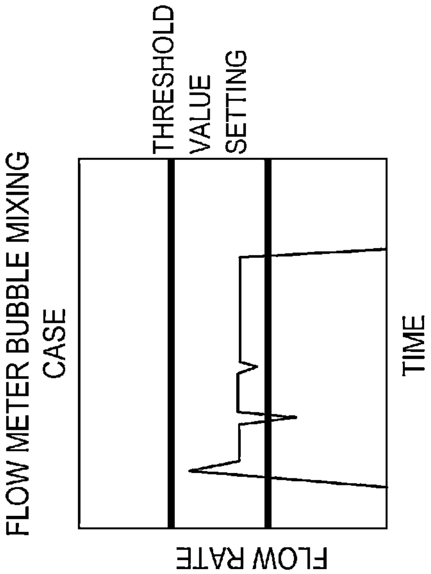

FIGS. 8A to 8C are diagrams explaining monitoring using a flow meter. In FIG. 8A to FIG. 8C, a horizontal axis represents time, a vertical axis represents a flow rate indicated by the flow meter, and a flow rate range between two lines represents a normal flow rate range. FIG. 8A illustrates a normal waveform (a waveform with a normal flow rate) in a flow meter. In the normal waveform illustrated in FIG. 8A, the flow rate indicated by the flow meter is within the normal range.

Regarding this, in FIG. 8B, once the flow rate is within the normal range, the flow rate immediately decreases, and then, the flow rate is continuously outside the normal range. In this case, it may be considered that an ejection amount change is caused in the configuration corresponding to the flow meter.

Also, in FIG. 8C, the flow rate temporarily decreases and falls outside the normal range. This temporary decrease in flow rate may be due to the occurrence of bubble mixing, for example, in the configuration corresponding to the flow meter. When bubbles are mixed, it becomes difficult to drain the liquid from the removal liquid nozzle 26, and the liquid stagnates at the tip of the removal liquid nozzle 26, making it prone to falling during processing. In addition, the removal liquid mixed with bubbles is likely to be disturbed during processing and may enter further internally than expected.

When the flow rate of the flow meter is outside the normal range, the analysis unit 115 performs a predetermined countermeasure to resolve defects on the configuration corresponding to the flow meter whose flow rate is outside the normal range. Here, for example, when flow meter measurement results of the sensors 83 and 84 which measure the flow rate before and after the filter 72 are outside the normal range, the analysis unit 115 specifies that the flowing state around the filter 72 is poor. In this case, the analysis unit 115 performs purging only for a specific time at the drain and removal liquid nozzle 26 connected to the filter 72.

The analysis unit 115 repeatedly performs purging before processing related to the substrate W until the flow rate of the flow meter falls within the normal range. When a change in the flow rate of the flow meter is not observed even after purging is repeatedly performed, the analysis unit 115 determines that there is a high possibility of a hardware failure. In this case, conveying of the substrate W is stopped.

For example, when the various sensors 81, 82, 83, 84, 85, and 86 include liquid pressure sensors, the analysis unit 115 may specify an abnormality factor based on a difference in liquid pressure measured by a pair of liquid pressure sensors that measure liquid pressure before and after each configuration. Specifically, the analysis unit 115 may specify the abnormality factor based on whether the difference in liquid pressure measured by the pair of liquid pressure sensors is within a predetermined range. When the difference in liquid pressure measured by the pair of liquid pressure sensors is outside a predetermined range, the analysis unit 115 determines that a flowing state of a configuration corresponding to the pair of liquid pressure sensors is poor.

Figure 9:
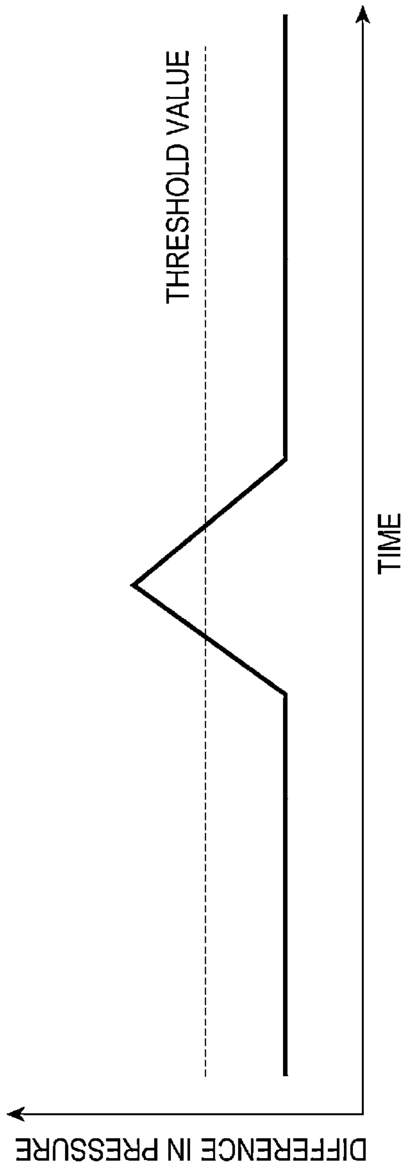
FIG. 9 is a diagram explaining monitoring using a liquid pressure sensor.

FIG. 9 is a diagram explaining monitoring using a liquid pressure sensor. In FIG. 9, a horizontal axis represents time, a vertical axis represents a difference in liquid pressure measured by a pair of liquid pressure sensors, and a broken line represents a threshold value of the difference in liquid pressure. As illustrated in FIG. 9, when the difference in liquid pressure measured by the pair of liquid pressure sensors is outside the normal range (greater than or equal to the threshold value), the analysis unit 115 performs a predetermined countermeasure to resolve defects on the configuration corresponding to the pair of liquid pressure sensors.

In this case, for example, when the difference in liquid pressure measured by the liquid pressure sensors (pair of liquid pressure sensors) of the sensors 83 and 84 that measure liquid pressure before and after the filter 72 is greater than or equal to the threshold value, the analysis unit 115 specifies that the flowing state around the filter 72 is poor. Then, the analysis unit 115 performs purging on the drain and the removal liquid nozzle 26 connected to the filter 72 for a specific period of time. Before processing related to the substrate W, the analysis unit 115 repeatedly performs purging until the difference in liquid pressure measured by the pair of liquid pressure sensors falls within the normal range. When the difference in liquid pressure measured by the pair of liquid pressure sensors does not fall below the threshold value even after purging is repeatedly performed, the analysis unit 115 determines that there is a high possibility of a hardware failure. In this case, conveying of the substrate W is stopped.

The analysis unit 115 may also specify the abnormality factor based on the surface potential of the removal liquid measured by a pair of surface electrometers that measure the surface potential of the removal liquid before and after each configuration, when, for example, the various sensors 81, 82, 83, 84, 85, 86 include the surface electrometers. Specifically, the analysis unit 115 may specify the abnormality factor based on whether the difference in the surface potential of the removal liquid measured by the pair of surface electrometers is within a predetermined range. When the difference in surface potential measured by the pair of surface electrometers is outside a predetermined range, the analysis unit 115 determines that a flowing state of a configuration corresponding to the pair of surface electrometers is poor.

Figure 10:
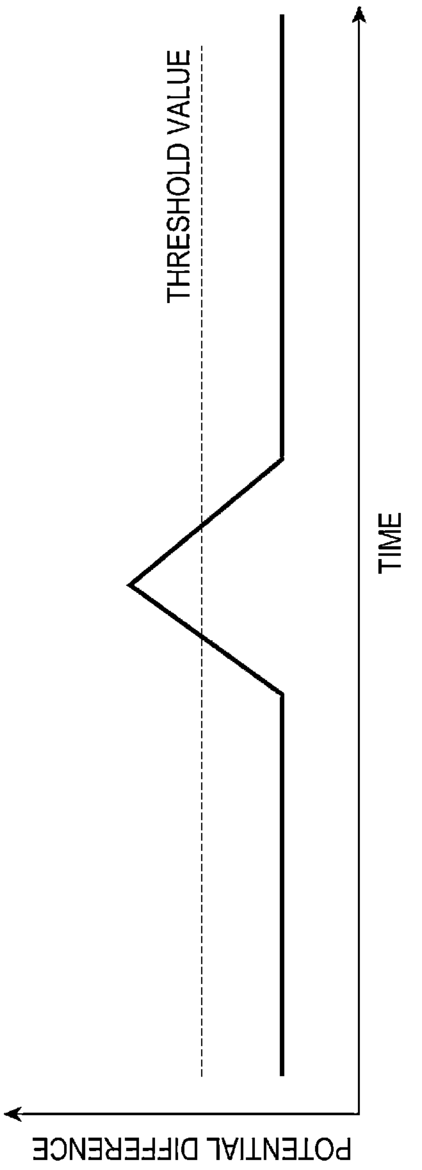
FIG. 10 is a diagram explaining monitoring using a surface electrometer.

FIG. 10 is a diagram explaining monitoring using a surface electrometer. In FIG. 10, a horizontal axis represents time, a vertical axis represents a difference in surface potential (potential difference) measured by a pair of surface electrometers, and a broken line represents a threshold value of the potential difference. The analysis unit 115 performs a predetermined countermeasure to resolve a defect for the configuration corresponding to the pair of surface electrometers when the potential difference measured by the pair of surface electrometers is outside the normal range (greater than or equal to the threshold value), as illustrated in FIG. 10.

At this time, for example, a case where a potential difference measured by the surface electrometers (the pair of surface electrometers) of the sensors 85 and 86 that measure the surface potential before and after the valve 73 is equal to or greater than the threshold value is considered. In this case, the analysis unit 115 specifies that a flowing state around the valve 73 is poor, performs electricity removal from the ground component 77 of the drain connected to the valve 73, and monitors an electricity-removed state over a period of time. Before processing related to the substrate W, the analysis unit 115 repeatedly performs electricity removal until the potential difference falls within a normal range. When the potential difference does not fall below the threshold value even after electricity removal is repeatedly performed, the analysis unit 115 determines that there is a high possibility of a hardware failure. In this case, conveying of the substrate W is stopped.

For example, the analysis unit 115 may specify the abnormality factor based on the ejection (flowing) state of the removal liquid ejected from the removal liquid nozzle 26, which is imaged by the sensor 90 that is a small high-speed camera. For example, when an image captured by the sensor 90 shows stagnation of the removal liquid at the time when the removal liquid nozzle 26 starts to be ejected or the liquid drains, the analysis unit 115 determines the flowing state of the removal liquid nozzle 26 is poor. In this case, the analysis unit 115 adjusts an opening degree of a speed controller (speed control valve) (adjusts the ejection state) associated with the removal liquid nozzle 26 to thereby eliminate the stagnation of the liquid.

The analysis unit 115 may notify a user (user of the applying and developing apparatus 2) of a specific abnormality factor (which region is poor and how poor it is). In this case, the analysis unit 115 may notify the user of the abnormality factor by, for example, displaying the specific abnormality factor on a display device (not illustrated) such as a display.

Furthermore, the analysis unit 115 acquires a process log of observation results by the various sensors 81, 82, 83, 84, 85, 86, 90 of the application unit U1, and, based on the process log, may specify each of abnormality factors related to a plurality of time periods by batch processing.

Figure 11:
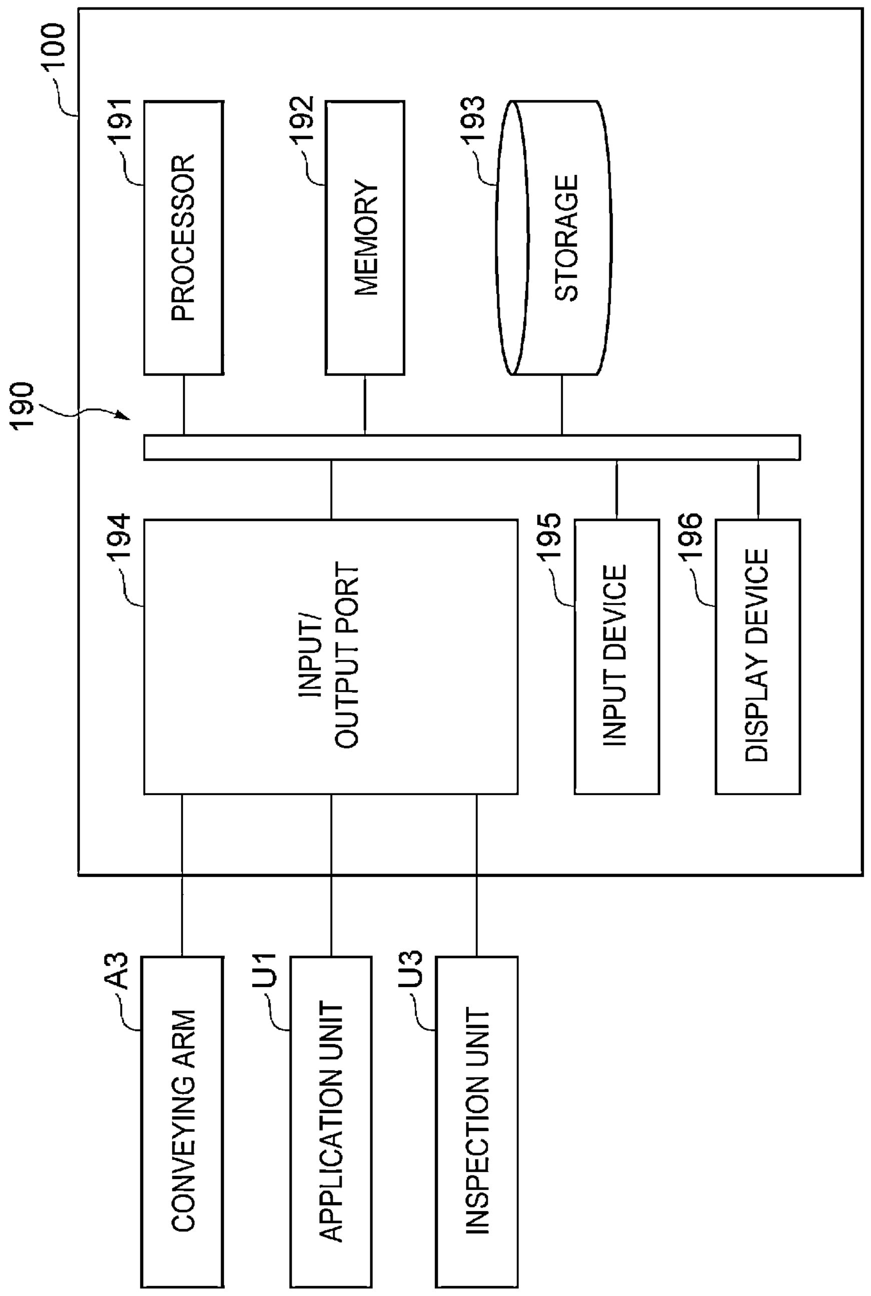
FIG. 11 is a diagram illustrating a hardware configuration of the controller.

FIG. 11 is a block diagram illustrating a hardware configuration of the controller 100. The controller 100 is constituted by one control computer or a plurality of control computers. As illustrated in FIG. 11, the controller 100 has a circuit 190. The circuit 190 includes at least one processor 191, a memory 192, a storage 193, an input/output port 194, an input device 195, and a display device 196.

The storage 193 has a storage medium that is readable by a computer, such as a hard disk. The storage 193 stores a program for causing the controller 100 to execute an information processing method of the substrate processing apparatus. For example, the storage 193 stores a program for configuring each of the above-described functional blocks in the controller 100.

The memory 192 temporarily stores the program loaded from the storage medium of the storage 193 and results of calculations by the processor 191. The processor 191 cooperates with the memory 192 to execute the program, thereby configuring each of functional modules described above. The input/output port 194 inputs and outputs electrical signals between the conveying arm A3, the application unit U1, and the inspection unit U3 in accordance with instructions from the processor 191.

The input device 195 and the display device 196 function as a user interface of the controller 100. The input device 195 is, for example, a keyboard, and acquires input information by the user. The display device 196 includes, for example, a liquid crystal monitor and is used to display information on the user. The display device 196 is used, for example, to display information of the factor. The input device 195 and the display device 196 may be integrated as a so-called touch panel.

[Defect Resolution Process Sequence]

Hereinafter, as an example of an information processing method by the substrate processing apparatus, a control sequence (defect resolution process sequence) of the applying and developing apparatus 2 by the control unit 100 is illustrated. In the following, descriptions will be made on a defect resolution process sequence (see FIG. 12) where a defect mode is first specified as splash abnormality, and the splash of the removal liquid from the cup 220 is suspected as an occurrence factor. Then, descriptions will be made on a defect resolution process sequence (see FIG. 13) where a defect mode is specified as splash abnormality, and the flowing state of the removal liquid in the flow path 261 (further, the ejection state thereof from the removal liquid nozzle 26) is suspected as an occurrence factor. Lastly, descriptions will be made on a defect resolution process sequence (see FIG. 14) when a defect mode is roughness abnormality. Each of processes illustrated in FIG. 12 may be performed in part or in whole by a user.

Figure 12:
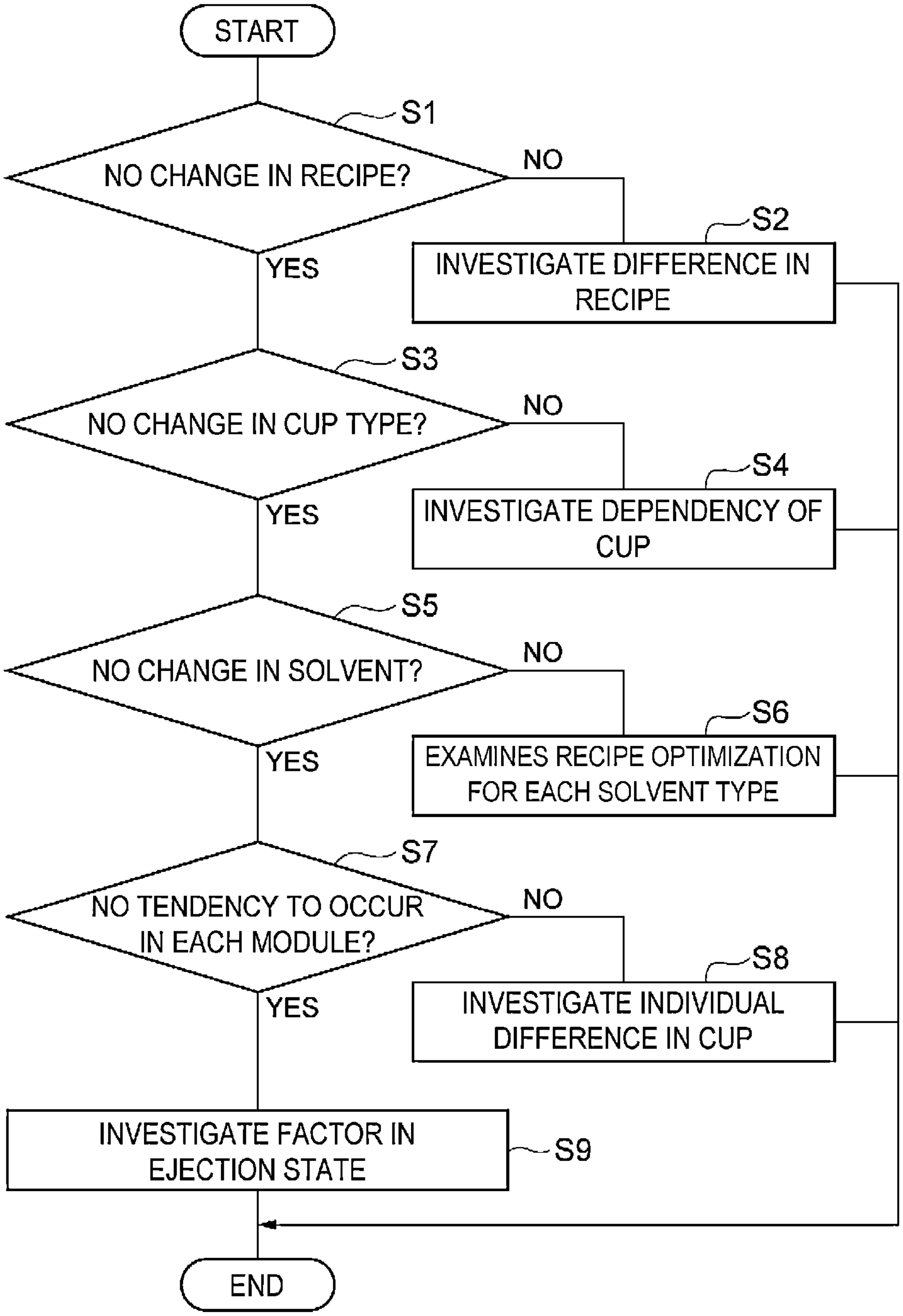
FIG. 12 is a flowchart illustrating a defect resolution process sequence when a splash occurs due to splashing from a cup.

In the defect resolution process sequence illustrated in FIG. 12, when splash abnormality occurs, the controller 100 first determines whether a recipe related to the removal of the periphery has not been changed (step S1). When the recipe has been changed, the controller 100 investigates a difference in the recipe before and after the change (step S2).

Meanwhile, when the recipe has not been changed, the controller 100 determines whether a type of the cup 220 has not been changed (step S3). When the type of the cup 220 has been changed, the controller 100 investigates dependency of the cup 220 related to the splash abnormality (step S4).

Meanwhile, when the type of the cup 220 has not been changed, the controller 100 determines whether a solvent has not been changed (step S5). When the solvent has been changed, the controller 100 performs recipe optimization for each solvent type.

Meanwhile, when the solvent has not been changed, the controller 100 determines whether there is no tendency for splash abnormality to occur in each module (step S7). When there is a tendency to occur in each module, an individual difference in the cup 220 is investigated by the controller 100 (step S8).

Meanwhile, when there is no tendency to occur in each module, the controller 100 determines that it is necessary to investigate an abnormality factor in the flowing state of the removal liquid in the flow path 261 (further, the ejection state thereof from the removal liquid nozzle 26) (step S9). In this case, processes illustrated in FIG. 13 are performed.

Figure 13:
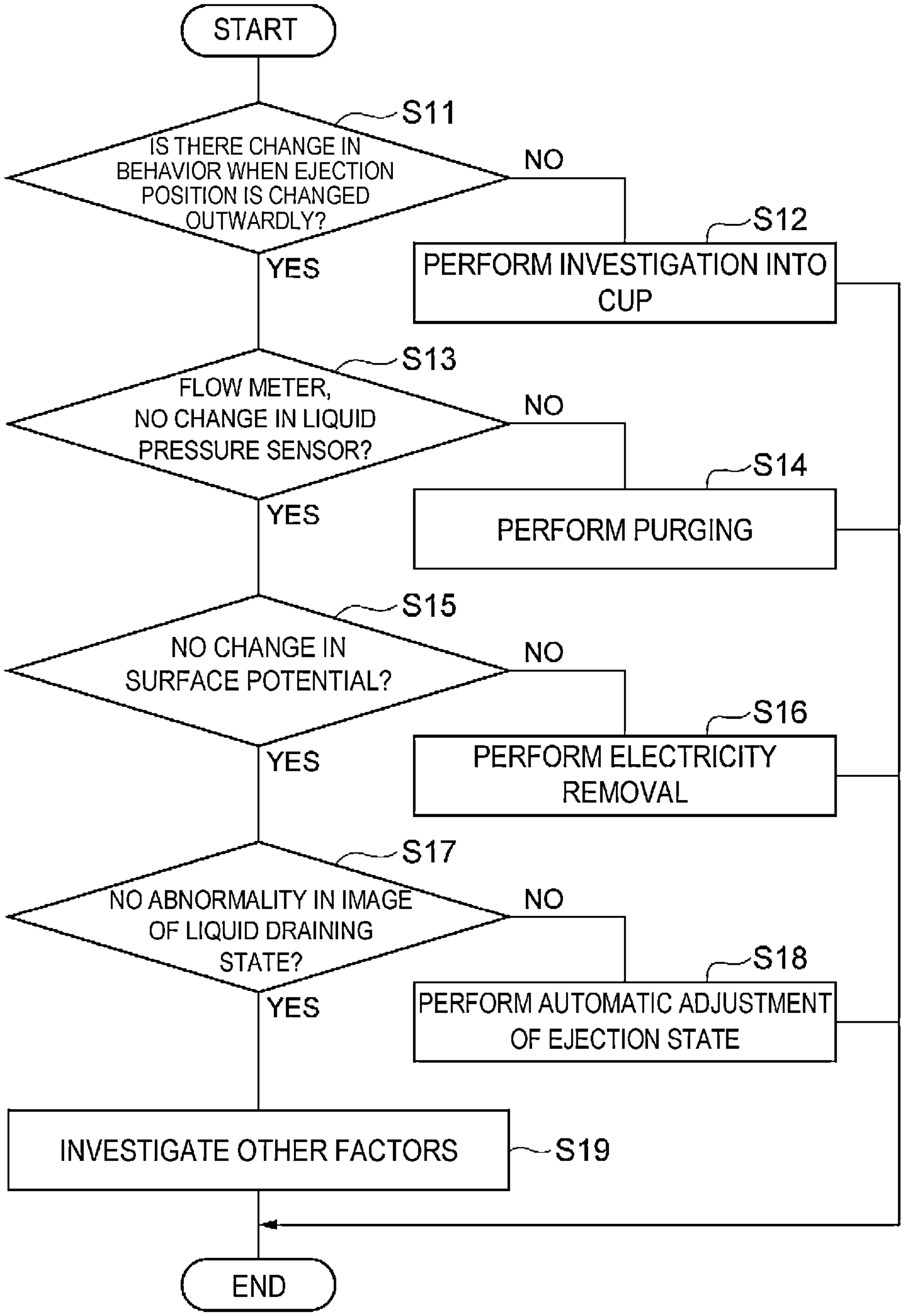
FIG. 13 is a flowchart illustrating a defect resolution process sequence when a splash occurs due to ejection abnormality.

In the defect resolution process sequence illustrated in FIG. 13, when splash abnormality occurs, the controller 100 causes an ejection position of the removal liquid nozzle 26 to be changed outwardly by a predetermined amount and determines whether its behavior changes (the splash abnormality decreases) (step S11). When the behavior does not change, the controller 100 performs an investigation into the cup 220 (step S12).

Meanwhile, when the behavior changes due to the change of the ejection position of the removal liquid nozzle 26, the controller 100 determines whether there is no change in a value of the flow meter or the liquid pressure sensor (whether the value becomes a value outside the normal range) (step S13). When the value of the flow meter or the liquid pressure sensor is outside the normal range, the controller 100 performs purging at the tip of the removal liquid nozzle 26 or the drain to discharge bubbles (step S14).

Meanwhile, when the value of the flow meter or the liquid pressure sensor is not outside the normal range, the controller 100 determines whether there is no change in a value of the surface electrometer (whether the value is outside the normal range) (step S15). When the value of the surface electrometer is outside the normal range, the controller 100 performs electricity removal in a configuration installed at the drain (step S16). In this case, the controller 100 may wait for a certain period of time and may monitor an electricity-removed state.

Meanwhile, when the value of the surface electrometer is not outside the normal range, the controller 100 determines whether an image of the liquid draining from the removal liquid nozzle 26, which is captured by the sensor 90 that is a small high-speed camera, does not indicate abnormality (step S17). When the abnormality is indicated, the controller 100 automatically adjusts an opening degree of a speed controller (speed control valve) associated with the removal liquid nozzle 26 (step S18).

Meanwhile, when the image of the liquid draining from the removal liquid nozzle 26 does not indicate abnormality, the controller 100 investigates other abnormality factors (such as abnormality related to the substrate W) (step S19).

Figure 14:
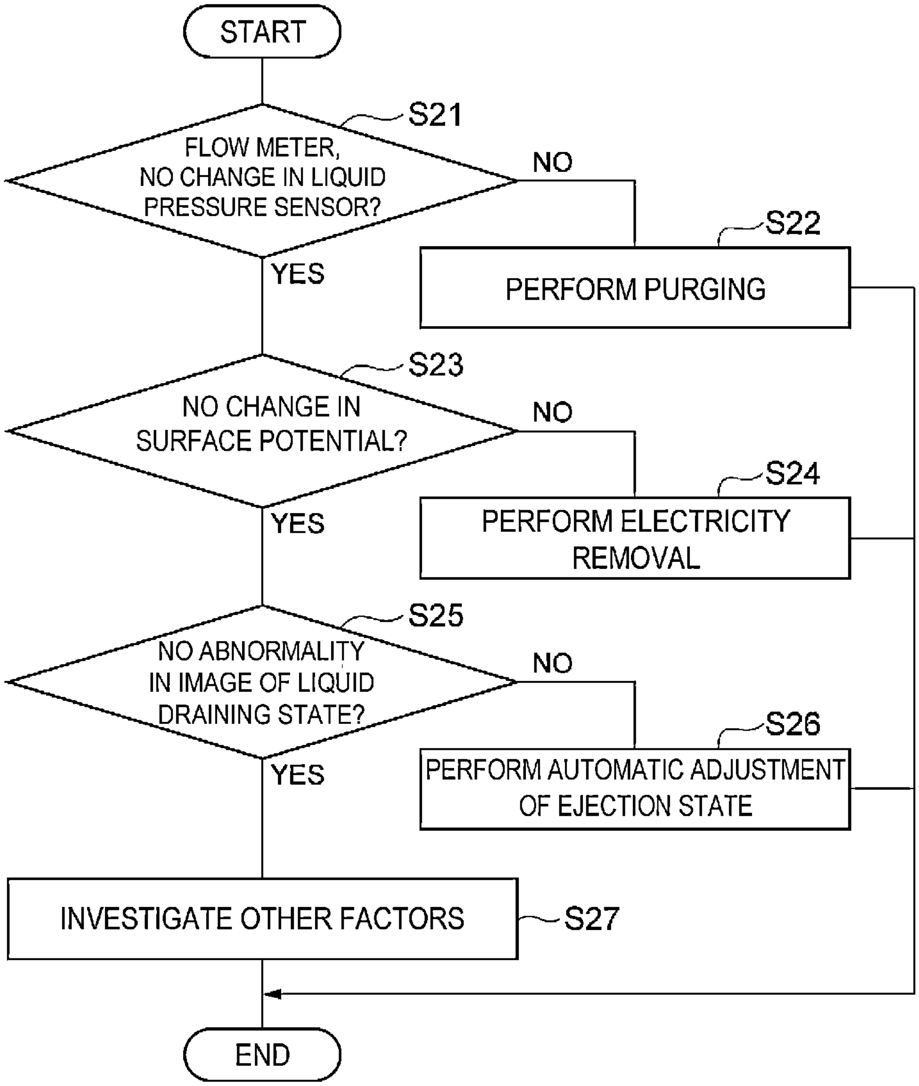
FIG. 14 is a flowchart illustrating a defect resolution process sequence when roughness occurs.

The defect process sequence illustrated in FIG. 14 (defect resolution process sequence when the defect mode is roughness abnormality) is approximately the same as the defect process sequence illustrated in FIG. 13. In detail, steps S21 through S27 of FIG. 14 are the same as steps S13 through S19 of FIG. 13. That is, in the defect resolution process sequence illustrated in FIG. 14, when roughness abnormality occurs, the controller 100 first determines whether the value of the flow meter or the liquid pressure sensor has not been changed (has not become a value outside the normal range) (step S21). When the value of the flow meter or the liquid pressure sensor is outside the normal range, the controller 100 performs purging at the tip of the removal liquid nozzle 26 or the drain to discharge bubbles (step S22).

Meanwhile, when the value of the flow meter or the liquid pressure sensor is not outside the normal range, the controller 100 determines whether the value of the surface electrometer has not been changed (has not become a value outside the normal range) (step S23). When the value of the surface electrometer is outside the normal range, the controller 100 performs electricity removal in the configuration installed at the drain (step S24). In this case, the controller 100 may wait for a certain period of time and may monitor an electricity-removed state.

Meanwhile, when the value of the surface electrometer is not outside the normal range, the controller 100 determines whether the image of the liquid draining from the removal liquid nozzle 26 captured by the sensor 90, which is a small high-speed camera, does not indicate abnormality (step S25). When the abnormality is indicated, the controller 100 automatically adjusts the opening degree of a speed controller (speed control valve) associated with the removal liquid nozzle 26 (step S26).

Meanwhile, when the image of the liquid draining from the removal liquid nozzle 26 does not indicate abnormality, other abnormality factors (such as abnormality related to the substrate W) are investigated by the controller 100 (step S27).

Effects of the Present Embodiments

As described above, the applying and developing apparatus 2 (substrate processing apparatus) includes the removal liquid nozzle 26 for ejecting a removal liquid to the periphery of the substrate W, and the flow path 261 which is a processing liquid supply path for allowing the removal liquid to flow between a supply source of the removal liquid and the removal liquid nozzle 26. In addition, the applying and developing apparatus 2 includes the image capturing unit 57 of the inspection unit U3 for capturing an image of the periphery of the substrate W, and the various sensors 81, 82, 83, 84, 85, 86, and 90 as observation units which are installed in the flow path 261 to observe a flowing state of the removal liquid in the flow path 261. In addition, the applying and developing apparatus 2 includes the analysis unit 115 which specifies abnormality factors related to the supply of the removal liquid to the substrate W based on images captured by the image capturing unit 57 of the inspection unit U3 and observation results by the various sensors 81, 82, 83, 84, 85, 86, 90.

In the applying and developing apparatus 2 related to the present embodiment, abnormality factors related to the supply of the removal liquid to the substrate W are specified, based on the images captured by the image capturing unit 57 of the inspection unit U3 and the observation results by the various sensors 81, 82, 83, 84, 85, 86, and 90. With the applying and developing apparatus 2, for example, abnormality in a supply state of the removal liquid to the periphery of the substrate W may be detected using the captured image, and the abnormality factor may be examined. In addition, with the applying and developing apparatus 2, by considering the observation results of the observation units which are actually provided in the flow path 261 to observe the flowing state of the removal liquid, it is possible to appropriately specify which region of the flow path 261 causes abnormality in the supply state of the processing liquid. As described above, with the applying and developing apparatus 2 according to the present embodiment, it is possible to specify abnormality factors related to the supply of the removal liquid in detail and precisely (with a high degree of precision).

The image capturing unit 57 captures an image of the periphery from which the film has been removed by the removal liquid, and the analysis unit 115 may specify a defect mode based on each pixel value of an inner circumferential area of the substrate W rather than the area from which the film has been removed in the image, and may specify an abnormality factor based on the specific defect mode and the observation result. By considering each pixel value of the inner circumferential area of the substrate W by the removal liquid, defect modes such as a scattering state of the removal liquid (the occurrence of splashes) or unevenness due to uneven removal of the film by the removal liquid (the occurrence of roughness) may be properly detected. By specifying the abnormality factor by taking these defect modes into consideration, the abnormality factors may be specified with higher precision.

The defect modes may include, as types thereof, a first defect mode in which each pixel value is a discrete value and a second defect mode in which each pixel value is a continuous value. The analysis unit 115 may specify the type of the defect mode, and may specify the abnormality factor associated with each of configurations, based on the specified type of the defect mode and a flowing state before and after the configuration of at least one of the pump 71, the filter 72, and the valve 73. In a case where a defect (abnormality) is detected based on the captured image, when each pixel value has a discrete value, it is assumed that a so-called splash (first defect mode) has occurred. In addition, when each pixel value takes a continuous value, it is assumed that so-called roughness (second defect mode) has occurred. In addition to this information, by acquiring observation results of the flowing state before and after each configuration of the flow path 261, it is possible to narrow down the details of the defect mode and specify a region where abnormality has occurred in detail, so abnormality factors can be specified with higher precision.

The analysis unit 115 may perform a predetermined countermeasure for each specific abnormality. Accordingly, an appropriate countermeasure can be implemented according to the abnormality factor to thereby appropriately resolve the abnormality related to the supply of the removal liquid.

The analysis unit 115 may also notify the user (user of the applying and developing apparatus 2) of the specified abnormality. Accordingly, it is possible to inform the user of the apparatus of which region the abnormality has occurred, and to urge the user to take action to resolve the abnormality.

The analysis unit 115 may acquire a process log of the observation results by the various sensors 81, 82, 83, 84, 85, 86, and 90 and, based on the process log, may specify each of the abnormality factors related to a plurality of time periods by batch processing. Accordingly, the abnormality factors may be efficiently specified by batch processing.

The various sensors 81, 82, 83, 84, 85, and 86 include a flow meter to measure the flow rate of the removal liquid, and the analysis unit 115 may specify the abnormality factor based on whether the flow rate of the removal liquid measured by the flow meter is within a predetermined range. Therefore, a decrease in the flow rate of the removal liquid may be appropriately detected, and the abnormality factor can be specified with high precision based on the detected information.

The various sensors 81, 82, 83, 84, 85, and 86 include a pair of liquid pressure sensors, and the analysis unit 115 may specify the abnormality factor based on whether the difference in the liquid pressure of the removal liquid measured by the pair of liquid pressure sensors is within a predetermined range. Accordingly, based on the difference in liquid pressure before and after the various configurations, the abnormality factors can be specified with high precision.

The various sensors 81, 82, 83, 84, 85, and 86 include a pair of surface electrometers, and the analysis unit 115 may specify an abnormality factor based on whether a difference between surface potentials of the removal liquid measured by the pair of surface electrometers is within a predetermined range. Accordingly, based on the difference between surface potentials before and after the various configurations, the abnormality factor can be specified with high precision.

LIST OF REFERENCE NUMERALS

2: applying and developing apparatus (substrate processing apparatus)
26: removal liquid nozzle (nozzle)
57: image capturing unit
81, 82, 83, 84, 85, 86, 90: sensors (observation units)
115: analysis unit
261: flow path (processing liquid supply path)
W: substrate

What is claimed is:

1. A substrate processing apparatus comprising:
a nozzle configured to eject a processing liquid to a periphery of a substrate;
a processing liquid supply path configured to allow the processing liquid to flow between a supply source of the processing liquid and the nozzle;
a camera configured to capture an image of the periphery of the substrate;
a sensor installed in the processing liquid supply path and configured to observe a flowing state of the processing liquid in the processing liquid supply path and acquire an observation result; and
an analyzer configured to classify a defect mode by analyzing a distribution of pixel values in a target area of the image and to specify an abnormality factor related to a supply of the processing liquid to the substrate by correlating a process log of the observation result with the classified defect mode.

2. The substrate processing apparatus according to claim 1, wherein
the target area is an inner circumferential area of the substrate rather than an area from which the film has been removed by the processing liquid in the image.

3. The substrate processing apparatus according to claim 1, wherein the defect mode includes a first defect mode in which each pixel value is a discrete value and a second defect mode in which each pixel value is a continuous value, as types thereof, and
the sensor observes the flowing state before and after at least one component of a valve, a filter, and a pump installed in the processing liquid supply path, and
the analyzer specifies the type of the defect mode and specifies the abnormality factor related to the at least one component based on the specified type of the defect mode and the flowing state before and after the at least one component.

4. The substrate processing apparatus according to claim 3, wherein the sensor includes a first liquid pressure sensor and a second liquid pressure sensor that measure liquid pressure of the processing liquid before and after at least one component of a valve, a filter, and a pump installed in the processing liquid supply path, and
the analyzer specifies the abnormality factor based on whether a difference in liquid pressure of the processing liquid measured by the first liquid pressure sensor and the second liquid pressure sensor is within a predetermined range.

5. The substrate processing apparatus according to claim 3, wherein the sensor includes a first surface electrometer and a second surface electrometer that measure a surface potential of the processing liquid before and after at least one component of a valve, a filter, and a pump installed in the processing liquid supply path, and
the analyzer specifies the abnormality factor based on whether a difference in the surface potential of the processing liquid measured by the first surface electrometer and the second surface electrometer is within a predetermined range.

6. The substrate processing apparatus according to claim 1, wherein the analyzer performs a predetermined countermeasure for each specified abnormality factor.

7. The substrate processing apparatus according to claim 1, wherein the analyzer notifies a user of the substrate processing apparatus of the specified abnormality factor.

8. The substrate processing apparatus according to claim 1, wherein the analyzer specifies the abnormality factor related to each of a plurality of time periods by batch processing the process log.

9. The substrate processing apparatus according to claim 1, wherein the sensor includes a flow meter that measures a flow rate of the processing liquid, and
the analyzer specifies the abnormality factor based on whether the flow rate of the processing liquid measured by the flow meter is within a predetermined range.

10. An information processing method comprising:
providing a substrate processing apparatus including a nozzle that ejects a processing liquid to a periphery of a substrate, and a processing liquid supply path that allows the processing liquid to flow between a supply source of the processing liquid and the nozzle;
acquiring a captured image of the periphery of the substrate after the processing liquid is supplied;
acquiring an observation result of a flowing state of the processing liquid in the processing liquid supply path;
classifying a defect mode by analyzing a distribution of pixel values in a target area of the image; and
specifying an abnormality factor related to a supply of the processing liquid to the substrate by correlating a process log of the observation result with the classified defect mode.

11. The information processing method according to claim 10, wherein
in the classifying the defect mode, the target area is an inner circumferential area of the substrate rather than an area from which the film has been removed by the processing liquid in the image.

12. The information processing method according to claim 10, wherein the defect mode includes a first defect mode in which each pixel value is a discrete value and a second defect mode in which each pixel value is a continuous value, as types thereof, and in the acquiring the observation result, the flowing state before and after at least one component of a valve, a filter, and a pump installed in the processing liquid supply path is observed, and in the specifying the abnormality factor, the type of the defect mode is specified and the abnormality factor related to the at least component is specified based on the specified type of the defect mode and the flowing state before and after the at least one component.

13. The information processing method according to claim 10, wherein in the specifying the abnormality factor, a predetermined countermeasure is performed for each specified abnormality factor.

14. The information processing method according to claim 10, wherein in the specifying the abnormality factor, the specified abnormality factor is notified to a user of the substrate processing apparatus.

15. The information processing method according to claim 10, wherein in the specifying the abnormality factor, the abnormality factor related to each of a plurality of time periods is specified by batch processing the process log.

16. The information processing method according to claim 10, wherein in the specifying the abnormality factor, the abnormality factor is specified based on whether a flow rate of the processing liquid measured by a flow meter that measures the flow rate of the processing liquid is within a predetermined range.

17. The information processing method according to claim 10, wherein in the specifying the abnormality factor, the abnormality factor is specified based on whether a difference in liquid pressure of the processing liquid measured by a first liquid pressure sensor and a second liquid pressure sensor that measure liquid pressure of the processing liquid before and after at least one component of a valve, a filter, and a pump installed in the processing liquid supply path is within a predetermined range.

18. The information processing method according to claim 10, wherein in the specifying the abnormality factor, the abnormality factor is specified based on whether a difference in the surface potential of the processing liquid measured by a first surface electrometer and a second surface electrometer that measure a surface potential of the processing liquid before and after at least one component of a valve, a filter, and a pump installed in the processing liquid supply path is within a predetermined range.

19. A non-transitory computer-readable storage medium in which a program for executing an information processing method on an apparatus is recorded, wherein the information processing method includes:

providing a substrate processing apparatus including a nozzle that ejects a processing liquid to a periphery of a substrate, and a processing liquid supply path that allows the processing liquid to flow between a supply source of the processing liquid and the nozzle;

acquiring a captured image of the periphery of the substrate after the processing liquid is supplied;

acquiring an observation result of a flowing state of the processing liquid in the processing liquid supply path;

classifying a defect mode by analyzing a distribution of pixel values in a target area of the image; and specifying an abnormality factor related to a supply of the processing liquid to the substrate by correlating a process log of the observation result with the classified defect mode.

* * * * *